United States Patent
Terakawa et al.

(10) Patent No.: US 7,863,518 B2
(45) Date of Patent: Jan. 4, 2011

(54) PHOTOVOLTAIC DEVICE

(75) Inventors: Akira Terakawa, Nara (JP); Toshio Asaumi, Koube (JP)

(73) Assignee: Sanyo Electric Co., Ltd., Osaka (JP)

( * ) Notice: Subject to any disclaimer, the term of this patent is extended or adjusted under 35 U.S.C. 154(b) by 943 days.

(21) Appl. No.: 10/793,844

(22) Filed: Mar. 8, 2004

(65) Prior Publication Data

US 2004/0182433 A1  Sep. 23, 2004

(30) Foreign Application Priority Data

Mar. 20, 2003 (JP) ............................. 2003-078115
Jan. 13, 2004 (JP) ............................. 2004-005071

(51) Int. Cl.
*H01L 31/00* (2006.01)
*H01L 31/04* (2006.01)
*H01L 31/075* (2006.01)
*H01L 31/20* (2006.01)

(52) U.S. Cl. ........................ 136/255; 136/256; 136/258; 136/261; 136/249; 257/438; 257/52; 257/53; 257/55; 257/56; 257/59; 257/79; 257/646; 438/57; 438/87; 438/96; 430/57.4; 430/58.1; 430/66; 430/95; 428/209

(58) Field of Classification Search .................. 136/255, 136/256, 258, 261, 249; 257/53, 438, 52, 257/55, 56, 59, 79, 646; 438/57, 87, 96; 430/57.4, 58.1, 66, 95; 428/209

See application file for complete search history.

(56) References Cited

U.S. PATENT DOCUMENTS 4,254,426 A * 3/1981 Pankove ...................... 257/646
4,490,733 A * 12/1984 Kroger ......................... 257/35

(Continued)

FOREIGN PATENT DOCUMENTS

DE          3143513 A  *  5/1983

(Continued)

OTHER PUBLICATIONS

Kim et al., Figure 5-p. 328, ("Positron annihilation induced Auger electron spectroscopy (PAES) study of the structure of Si/H/Ge (100) interfaces", Applied Surface Science, vol. 11 (1997), pp. 324-329.*

(Continued)

*Primary Examiner*—Alexa D Neckel
*Assistant Examiner*—Golam Mowla
(74) *Attorney, Agent, or Firm*—McDermott Will & Emery LLP

(57) ABSTRACT

A photovoltaic device capable of improving output characteristics is provided. This photovoltaic device comprises a crystalline semiconductor member, a substantially intrinsic first amorphous semiconductor layer formed on the front surface of the crystalline semiconductor member and a first conductivity type second amorphous semiconductor layer formed on the front surface of the first amorphous semiconductor layer, and has a hydrogen concentration peak in the first amorphous semiconductor layer. Thus, the quantity of hydrogen atoms in the first amorphous semiconductor layer is so increased that the hydrogen atoms increased in quantity can be bonded to dangling bonds of silicon atoms forming defects in the first amorphous semiconductor layer for inactivating the dangling bonds.

15 Claims, 3 Drawing Sheets

U.S. PATENT DOCUMENTS

| | | | |
|---|---|---|---|
| 4,529,679 A * | 7/1985 | Ogawa et al. | 430/58.1 |
| 4,555,465 A * | 11/1985 | Ogawa et al. | 430/95 |
| 4,569,892 A * | 2/1986 | Saitoh | 430/57.5 |
| 4,571,370 A * | 2/1986 | Saitoh | 430/57.6 |
| 4,722,880 A * | 2/1988 | Takeda et al. | 430/84 |
| 4,742,384 A * | 5/1988 | Pankove et al. | 257/646 |
| 4,786,574 A * | 11/1988 | Shirai et al. | 430/66 |
| 5,008,726 A * | 4/1991 | Nakagawa et al. | 257/458 |
| 5,032,884 A * | 7/1991 | Yamagishi et al. | 257/458 |
| 5,114,498 A * | 5/1992 | Okamoto et al. | 136/258 |
| 5,140,397 A * | 8/1992 | Haga et al. | 257/53 |
| 5,204,272 A | 4/1993 | Guha et al. | |
| 5,213,628 A | 5/1993 | Noguchi et al. | |
| 5,252,142 A * | 10/1993 | Matsuyama et al. | 136/255 |
| 5,288,658 A * | 2/1994 | Ishihara | 438/485 |
| 5,324,364 A * | 6/1994 | Matsuda et al. | 136/249 |
| 5,429,685 A * | 7/1995 | Saito et al. | 136/255 |
| 5,514,506 A * | 5/1996 | Takai et al. | 430/57.7 |
| 5,521,127 A * | 5/1996 | Hori | 438/770 |
| 5,563,075 A * | 10/1996 | Saito et al. | 438/87 |
| 5,563,425 A * | 10/1996 | Saito et al. | 257/53 |
| 5,620,906 A * | 4/1997 | Yamaguchi et al. | 438/162 |
| 5,644,145 A * | 7/1997 | Ishihara | 257/52 |
| 5,676,765 A * | 10/1997 | Saito et al. | 136/258 |
| 5,705,828 A | 1/1998 | Noguchi et al. | |
| 5,736,431 A | 4/1998 | Shinohara et al. | |
| 5,751,013 A * | 5/1998 | Kidoguchi et al. | 257/13 |
| 5,769,963 A * | 6/1998 | Fujioka et al. | 136/258 |
| 5,923,967 A * | 7/1999 | Yamamoto | 438/162 |
| 6,043,427 A | 3/2000 | Nishimoto | |
| 6,124,545 A | 9/2000 | Bauer et al. | |
| 6,162,710 A * | 12/2000 | Ito et al. | 438/528 |
| 6,288,325 B1 * | 9/2001 | Jansen et al. | 136/249 |
| 6,515,219 B2 * | 2/2003 | Kondo | 136/256 |
| 6,617,010 B2 * | 9/2003 | Yoshimi et al. | 428/209 |
| 2001/0013362 A1 * | 8/2001 | Kondo | 136/265 |
| 2002/0011264 A1 | 1/2002 | Saito | |
| 2002/0069911 A1 * | 6/2002 | Nakamura et al. | 136/243 |
| 2003/0020118 A1 * | 1/2003 | Kajiwara et al. | 257/347 |
| 2004/0038051 A1 * | 2/2004 | Fujisawa et al. | 428/469 |
| 2004/0125221 A1 * | 7/2004 | Kakumoto | 348/243 |
| 2004/0149330 A1 * | 8/2004 | Sugiyama et al. | 136/249 |

FOREIGN PATENT DOCUMENTS

| | | | |
|---|---|---|---|
| EP | 1 187 223 A2 | | 3/2002 |
| JP | 60240169 A | * | 11/1985 |
| JP | 64-71182 | | 3/1989 |
| JP | 03177077 A | * | 8/1991 |
| JP | 05048130 A | * | 2/1993 |
| JP | 5-136440 | | 6/1993 |
| JP | 06181325 A | * | 6/1994 |
| JP | 06181329 A | * | 6/1994 |
| JP | 7-95603 | | 10/1995 |
| JP | 11072938 A | * | 3/1999 |
| JP | P2001-345463 A | | 12/2001 |
| JP | P2002-76409 A | | 3/2002 |

OTHER PUBLICATIONS

European Search Report issued in European Patent Application No. 04251500.7 dated on Apr. 17, 2007.

* cited by examiner

PHOTOVOLTAIC DEVICE

BACKGROUND OF THE INVENTION

1. Field of the Invention

The present invention relates to a photovoltaic device, and more particularly, it relates to a photovoltaic device having amorphous semiconductor layers formed on a crystalline semiconductor member.

2. Description of the Background Art

In relation to a photovoltaic device prepared by forming a second conductivity type amorphous silicon layer on the front surface of a first conductivity type crystalline silicon substrate thereby forming a p-n junction, a technique of inserting a substantially intrinsic amorphous silicon layer between the first conductivity type crystalline silicon substrate and the second conductivity type amorphous silicon layer thereby improving junction characteristics is known in general. For example, Japanese Patent Laying-Open No. 2001-345463 discloses this technique.

The aforementioned Japanese Patent Laying-Open No. 2001-345463 discloses a photovoltaic device prepared by successively forming a substantially intrinsic amorphous silicon layer and a p-type amorphous silicon layer on an n-type single-crystalline silicon substrate while introducing boron into a clearance between the n-type single-crystalline silicon substrate and the substantially intrinsic amorphous silicon layer. According to this patent literature, the substantially intrinsic non-doped amorphous silicon layer and the p-type amorphous silicon layer are formed on the n-type single-crystalline silicon substrate by plasma CVD at a low temperature of not more than about 200° C., whereby thermal damage as well as interdiffusion between p- and n-type impurities can be suppressed dissimilarly to a case of diffusing a p-type impurity from the surface of the n-type single-crystalline silicon substrate by thermal diffusion at a high temperature of at least about 800° C. thereby forming a p-n junction. Consequently, excellent junction characteristics can be attained.

However, the aforementioned photovoltaic device disclosed in Japanese Patent Laying-Open No. 2001-345463 has no sufficient countermeasure for suppressing recombination of carriers caused by dangling bonds forming defects in the substantially intrinsic amorphous silicon layer when carriers formed in the single-crystalline silicon substrate are moved into the p-type amorphous silicon layer through the substantially intrinsic amorphous silicon layer. Therefore, photo-produced carriers disappear in the substantially intrinsic amorphous silicon layer due to recombination, and hence it is disadvantageously difficult to improve the output characteristics of the photovoltaic device.

SUMMARY OF THE INVENTION

The present invention has been proposed in order to solve the aforementioned problem, and an object thereof is to provide a photovoltaic device capable of improving output characteristics.

In order to attain the aforementioned object, a photovoltaic device according to a first aspect of the present invention comprises a crystalline semiconductor member, a substantially intrinsic first amorphous semiconductor layer formed on the front surface of the crystalline semiconductor member and a first conductivity type second amorphous semiconductor layer formed on the front surface of the first amorphous semiconductor layer, and has a hydrogen concentration peak in the first amorphous semiconductor layer. In relation to the present invention, the term "crystalline semiconductor member" denotes a wide concept including a crystalline semiconductor substrate or a thin-film polycrystalline semiconductor member formed on a substrate. Further, the term "amorphous semiconductor" denotes a wide concept including a microcrystalline semiconductor in relation to the present invention.

In the photovoltaic device according to the first aspect, as hereinabove described, the first amorphous semiconductor layer is so formed that the photovoltaic device has the hydrogen concentration peak in the first amorphous semiconductor layer for increasing the quantity of hydrogen atoms (H) in the first amorphous semiconductor layer, whereby the hydrogen atoms increased in quantity can be bonded to dangling bonds of silicon atoms (Si) forming defects in the first amorphous semiconductor layer for inactivating the dangling bonds. Thus, the number of defects can be so reduced in the first amorphous semiconductor layer that the defects in the first amorphous semiconductor layer can be inhibited from capturing carriers formed in the crystalline semiconductor member and moved into the second amorphous semiconductor layer through the first amorphous semiconductor layer. Consequently, the carriers can be inhibited from recombination in the first amorphous semiconductor layer, thereby improving the output characteristics of the photovoltaic device. Further, the number of Si—H bonds in the first amorphous semiconductor layer can be increased by increasing the quantity of the hydrogen atoms (H) in the first amorphous semiconductor layer. In this case, the Si—H bonds having larger bond energy than Si—Si bonds can increase the total interatomic bond energy in the first amorphous semiconductor layer. Thus, the band gap of the first amorphous semiconductor layer can be so increased that a built-in electric field in a p-i-n junction can be increased. Thus, the open-circuit voltage of the photovoltaic device can be increased. Further, the light absorption loss of the first amorphous semiconductor layer can be reduced due to the increased band gap. Thus, the quantity of light incident upon the crystalline semiconductor member can be increased, thereby increasing the quantity of power generation in the crystalline semiconductor member. Therefore, the short-circuit current of the photovoltaic device can be increased. Thus, the open-circuit voltage and the short-circuit current can be so increased that the cell output of the photovoltaic device can also be increased. Consequently, the output characteristics of the photovoltaic device can be improved. When a region of the hydrogen concentration peak in the first amorphous semiconductor layer closer to the second amorphous semiconductor layer is set to a hydrogen concentration level lower than the value of the hydrogen concentration peak in the first amorphous semiconductor layer, the hydrogen concentration on the interface between the first and second amorphous semiconductor layers can be set to a level lower than the hydrogen concentration peak in the first amorphous semiconductor layer. Thus, the quantity of hydrogen atoms diffused into the second amorphous semiconductor layer from the interface between the first and second amorphous semiconductor layers can be reduced as compared with a case where the hydrogen concentration on the interface between the first and second amorphous semiconductor layers is higher than the hydrogen concentration peak in the first amorphous semiconductor layer. Therefore, the rate of activation for a first conductivity type impurity in the second amorphous semiconductor layer can be inhibited from reduction resulting from the diffused hydrogen atoms, whereby the photovoltaic device can be inhibited from reduction of the output characteristics.

In the aforementioned photovoltaic device according to the first aspect, the first amorphous semiconductor layer preferably has a small thickness substantially not contributing to power generation. According to this structure, the resistance of the first amorphous semiconductor layer along the thickness direction can be inhibited from increase resulting from a large thickness of the first amorphous semiconductor layer. Thus, carriers formed in the crystalline semiconductor member can be inhibited from difficulty in movement into the second amorphous semiconductor layer through the first amorphous semiconductor layer. Therefore, the output characteristics of the photovoltaic device can be inhibited from reduction. The thickness of the first amorphous semiconductor layer substantially not contributing to power generation is in the range of several/10 nm (several Å) to about 25 nm.

In this case, the first amorphous semiconductor layer preferably has a thickness of at least about 6 nm and not more than about 15 nm, and more preferably at least about 9 nm and not more than about 13 nm. According to this structure, the first amorphous semiconductor layer can be easily set to the small thickness substantially not contributing to power generation.

In the aforementioned photovoltaic device according to the first aspect, the hydrogen concentration on the interface between the first and second amorphous semiconductor layers is preferably set lower than the hydrogen concentration peak in the first amorphous semiconductor layer. According to this structure, the quantity of hydrogen atoms diffused into the second amorphous semiconductor layer from the interface between the first and second amorphous semiconductor layers can be reduced as compared with the case where the hydrogen concentration on the interface between the first and second amorphous semiconductor layers is higher than the hydrogen concentration peak in the first amorphous semiconductor layer. Thus, the rate of activation for a first conductivity type impurity in the second amorphous semiconductor layer can be inhibited from reduction resulting from the diffused hydrogen atoms, whereby the photovoltaic device can be inhibited from reduction of the output characteristics.

In the aforementioned photovoltaic device according to the first aspect, the difference between the value of the hydrogen concentration peak in the first amorphous semiconductor layer and the minimum value of the hydrogen concentration in the first amorphous semiconductor layer is preferably at least about $9 \times 10^{20}$ atoms/cm$^3$. According to this structure, the first amorphous semiconductor layer can be provided with hydrogen atoms in a quantity sufficient for improving the output characteristics of the photovoltaic device.

In the aforementioned photovoltaic device according to the first aspect, the hydrogen concentration peak in the first amorphous semiconductor layer is preferably located in the vicinity of the central portion of the first amorphous semiconductor layer along the thickness direction. According to this structure, the quantity of the hydrogen atoms is increased in the vicinity of the central portion of the first amorphous semiconductor layer along the thickness direction, whereby the number of defects can be reduced in the vicinity of the central portion of the first amorphous semiconductor layer along the thickness direction. Consequently, carriers can be inhibited from recombination in the vicinity of the central portion of the first amorphous semiconductor layer along the thickness direction.

In the aforementioned photovoltaic device according to the first aspect, the hydrogen concentration peak in the first amorphous semiconductor layer is preferably located on a position closer to the interface between the first and second amorphous semiconductor layers than the central portion of the first amorphous semiconductor layer along the thickness direction. According to this structure, inclination of the valence band of the amorphous semiconductor layer formed to reflect the shape of the hydrogen concentration peak is reduced in a region closer to the crystalline semiconductor member. When the inclination of the valence band is reduced, holes can be easily moved from the crystalline semiconductor member into the second amorphous semiconductor layer through the first amorphous semiconductor layer. Consequently, the holes can be so easily collected as to improve the output characteristics of the photovoltaic device.

In this case, the hydrogen concentration peak in the first amorphous semiconductor layer is preferably located in the vicinity of the interface between the first and second amorphous semiconductor layers. According to this structure, the inclination of the valence band of the first amorphous semiconductor layer formed to reflect the shape of the hydrogen concentration peak is further reduced in the region closer to the crystalline semiconductor member. When the inclination of the valence band is further reduced, the holes can be further easily moved from the crystalline semiconductor member into the second amorphous semiconductor layer through the first amorphous semiconductor layer. Consequently, the holes can be so further easily collected as to further improve the output characteristics of the photovoltaic device.

In this case, the photovoltaic device preferably has two hydrogen concentration peaks in the first amorphous semiconductor layer. According to this structure, the valence band of the first amorphous semiconductor layer formed to reflect the shapes of the two hydrogen concentration peaks is stepped when the hydrogen concentration peak closer to the second amorphous semiconductor layer is larger than that closer to the crystalline semiconductor member, for example. Thus, the holes can be further easily moved from the crystalline semiconductor member into the second amorphous semiconductor layer through the first amorphous semiconductor layer as compared with the case of having only one hydrogen concentration peak. Consequently, the holes can be so further easily collected as to further improve the output characteristics of the photovoltaic device.

The aforementioned photovoltaic device according to the first aspect preferably further comprises a substantially intrinsic third amorphous semiconductor layer formed on the back surface of the crystalline semiconductor member and a second conductivity type fourth amorphous semiconductor layer formed on the back surface of the third amorphous semiconductor layer, and has a hydrogen concentration peak in the third amorphous semiconductor layer. According to this structure, the quantity of hydrogen atoms (H) in the third amorphous semiconductor layer is so increased that the hydrogen atoms increased in quantity can be bonded to dangling bonds of silicon atoms (Si) forming defects in the third amorphous semiconductor layer for inactivating the dangling bonds. Thus, the number of defects can be so reduced in the third amorphous semiconductor layer that the defects can be inhibited from capturing carriers. Consequently, the carriers can be inhibited from recombination in the third amorphous semiconductor layer.

In the aforementioned structure including the third amorphous semiconductor layer, the third amorphous semiconductor layer preferably has a small thickness substantially not contributing to power generation. According to this structure, the resistance of the third amorphous semiconductor layer along the thickness direction can be inhibited from increase resulting from a large thickness of the third amorphous semiconductor layer. Thus, carriers formed in the crystalline semiconductor member can be inhibited from difficulty in movement into the fourth amorphous semiconductor layer through the third amorphous semiconductor layer. Therefore, the output characteristics of the photovoltaic device can be inhibited from reduction. The thickness of the third amorphous semiconductor layer substantially not contributing to power generation is in the range of several/10 nm (several Å) to about 25 nm.

In this case, the third amorphous semiconductor layer preferably has a thickness of at least about 6 nm and not more than about 15 nm, more preferably at least about 9 nm and not more than about 13 nm. According to this structure, the third amorphous semiconductor layer can be easily set to the small thickness substantially not contributing to power generation.

In the aforementioned structure including the third and fourth amorphous semiconductor layers, the hydrogen concentration on the interface between the third and fourth amorphous semiconductor layers is preferably set lower than the hydrogen concentration peak in the third amorphous semiconductor layer. According to this structure, the quantity of hydrogen atoms diffused into the fourth amorphous semiconductor layer from the interface between the third and fourth amorphous semiconductor layers can be reduced as compared with a case where the hydrogen concentration on the interface between the third and fourth amorphous semiconductor layers is higher than the hydrogen concentration peak in the third amorphous semiconductor layer. Therefore, the rate of activation for a second conductivity type impurity in the fourth amorphous semiconductor layer can be inhibited from reduction resulting from the diffused hydrogen atoms, whereby the photovoltaic device can be inhibited from reduction of the output characteristics.

In the aforementioned structure including the third amorphous semiconductor layer, the difference between the value of the hydrogen concentration peak in the third amorphous semiconductor layer and the minimum value of the hydrogen concentration in the third amorphous semiconductor layer is preferably at least about $9 \times 10^{20}$ atoms/cm$^3$. According to this structure, the third amorphous semiconductor layer can be provided with hydrogen atoms in a quantity sufficient for improving the output characteristics of the photovoltaic device.

In the aforementioned structure including the third amorphous semiconductor layer, the hydrogen concentration peak in the third amorphous semiconductor layer is preferably located in the vicinity of the central portion of the third amorphous semiconductor layer along the thickness direction. According to this structure, the quantity of the hydrogen atoms is increased in the vicinity of the central portion of the third amorphous semiconductor layer along the thickness direction, whereby the number of defects can be reduced in the vicinity of the central portion of the third amorphous semiconductor layer along the thickness direction. Consequently, carriers can be inhibited from recombination in the vicinity of the central portion of the third amorphous semiconductor layer along the thickness direction.

In the aforementioned photovoltaic device according to the first aspect, the crystalline semiconductor member is preferably a second conductivity type semiconductor member. According to this structure, carriers can be inhibited from recombination in the first amorphous semiconductor layer while the band gap of the first amorphous semiconductor layer can be increased in the photovoltaic device having the substantially intrinsic first amorphous semiconductor layer and the first conductivity type second amorphous semiconductor layer stacked on the second conductivity type crystalline semiconductor member, whereby the output characteristics of the photovoltaic device can be improved.

In the aforementioned photovoltaic device according to the first aspect, the second amorphous semiconductor layer is preferably a p-type semiconductor layer, and the crystalline semiconductor member is preferably an n-type semiconductor member. According to this structure, carriers can be inhibited from recombination in the first amorphous semiconductor layer while the band gap of the first amorphous semiconductor layer can be increased in the photovoltaic device having the substantially intrinsic first amorphous semiconductor layer and the p-type second amorphous semiconductor layer stacked on the n-type crystalline semiconductor member, whereby the output characteristics of the photovoltaic device can be improved.

In the aforementioned structure including the fourth amorphous semiconductor layer, the fourth amorphous semiconductor layer is preferably an n-type semiconductor layer. According to this structure, carriers can be inhibited from recombination in the third amorphous semiconductor layer while the band gap of the third amorphous semiconductor layer can be increased in the photovoltaic device having the substantially intrinsic third amorphous semiconductor layer and the n-type fourth amorphous semiconductor layer stacked on the back surface of the n-type crystalline semiconductor member, whereby the output characteristics of the photovoltaic device can be improved.

A photovoltaic device according to a second aspect of the present invention comprises a first conductivity type silicon single-crystalline substrate, a substantially intrinsic first amorphous silicon layer formed on the front surface of the silicon single-crystalline substrate and a second conductivity type second amorphous silicon layer formed on the front surface of the first amorphous silicon layer, and has a hydrogen concentration peak in the first amorphous silicon layer.

In the photovoltaic device according to the second aspect, as hereinabove described, the first amorphous silicon layer is so formed that the photovoltaic device has the hydrogen concentration peak in the first amorphous silicon layer for increasing the quantity of hydrogen atoms (H) in the first amorphous silicon layer, whereby the hydrogen atoms increased in quantity can be bonded to dangling bonds of silicon atoms (Si) forming defects in the first amorphous silicon layer for inactivating the dangling bonds. Thus, the number of defects can be so reduced in the first amorphous silicon layer that the defects in the first amorphous silicon layer can be inhibited from capturing carriers formed in the silicon single-crystalline substrate and moved into the second amorphous silicon layer through the first amorphous silicon layer. Consequently, the carriers can be inhibited from recombination in the first amorphous silicon layer, whereby the output characteristics of the photovoltaic device can be improved. Further, the number of Si—H bonds in the first amorphous silicon layer can be increased by increasing the quantity of the hydrogen atoms (H) in the first amorphous silicon layer. In this case, the Si—H bonds having larger bond energy than Si—Si bonds can increase the total interatomic bond energy in the first amorphous silicon layer. Thus, the band gap of the first amorphous silicon layer can be so increased that a built-in electric field in a p-i-n junction can be increased. Therefore, an open-circuit voltage of the photovoltaic device can be increased. Further, the light absorption loss of the first amorphous silicon layer can be reduced due to the increased band gap. Thus, the quantity of light incident upon the silicon single-crystalline substrate can be increased, thereby increasing the quantity of power generation in the silicon single-crystalline substrate. Therefore, the short-circuit current of the photovoltaic device can be increased. Thus, the open-circuit voltage and the short-circuit current can be so increased that the cell output of the photovoltaic device can also be increased. Consequently, the output characteristics of the photovoltaic device can be improved. When a region of the hydrogen concentration peak in the first amorphous silicon layer closer to the second amorphous silicon layer is set to a hydrogen concentration level lower than the value of the hydrogen concentration peak in the first amorphous silicon layer, the hydrogen concentration on the interface between the first and second amorphous silicon layers can be set to a level lower than the hydrogen concentration peak in the first amorphous silicon layer. Thus, the quantity of hydrogen atoms diffused into the second amorphous silicon layer from the interface between the first and second amorphous silicon layers can be reduced as compared with a case where the hydrogen concentration on the interface between the first and second amorphous silicon layers is higher than the hydrogen concentration peak in the first amorphous silicon layer. Therefore, the rate of activation for a second conductivity type impurity in the second amorphous silicon layer can be inhibited from reduction resulting from the diffused hydrogen atoms, whereby the photovoltaic device can be inhibited from reduction of the output characteristics.

The aforementioned photovoltaic device according to the second aspect preferably further comprises a substantially intrinsic third amorphous silicon layer formed on the back surface of the first conductivity type silicon single-crystalline substrate and a first conductivity type fourth amorphous silicon layer formed on the back surface of the third amorphous silicon layer, and has a hydrogen concentration peak in the third amorphous silicon layer. According to this structure, the quantity of hydrogen atoms (H) in the third amorphous silicon layer is so increased that the hydrogen atoms increased in quantity can be bonded to dangling bonds of silicon atoms (Si) forming defects in the third amorphous silicon layer for inactivating the dangling bonds. Thus, the number of the defects can be so reduced in the third amorphous silicon layer that the defects can be inhibited from capturing carriers. Consequently, the carriers can be inhibited from recombination in the third amorphous silicon layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structure of a photovoltaic device according to the embodiment is described with reference to FIG. 1.

Figure 1:
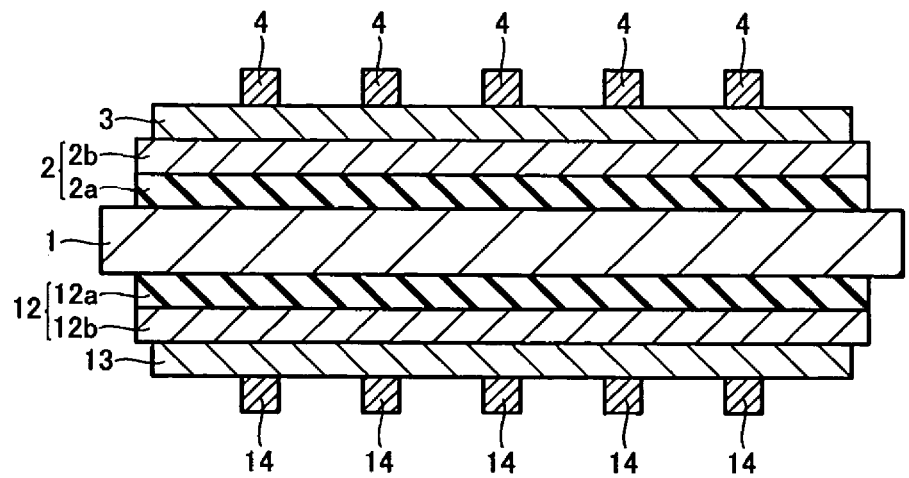
FIG. 1 is a sectional view showing the structure of a photovoltaic device according to an embodiment of the present invention.

In the photovoltaic device according to the embodiment, an amorphous silicon layer 2, a front electrode 3 of ITO (indium tin oxide) having a thickness of about 70 nm to about 100 nm and a collector 4 of silver having a thickness of several 10 µm are successively formed on the upper surface of a hydrotreated single-crystalline silicon substrate 1, as shown in FIG. 1. The amorphous silicon layer 2 is constituted of a substantially intrinsic i-type amorphous silicon layer 2a having a small thickness of about 9 nm to about 13 nm formed on the upper surface of the n-type single-crystalline silicon substrate 1 and a p-type amorphous silicon layer 2b, doped with boron (B), having a thickness of about 2 nm to about 5 nm formed on the i-type amorphous silicon layer 2a. The i-type amorphous silicon layer 2a mainly functions to reduce the interfacial level between the n-type single-crystalline silicon substrate 1 and the p-type amorphous silicon layer 2b. The i-type amorphous silicon layer 2a is set to the small thickness of about 9 nm to about 13 nm, in order not to substantially contribute to power generation.

According to this embodiment, the i-type amorphous silicon layer 2a provided on the light receiving side is so formed that the photovoltaic device has a hydrogen concentration peak therein. The difference between the value of the hydrogen concentration peak in the i-type amorphous silicon layer 2a and the minimum value of the hydrogen concentration in the i-type amorphous silicon layer 2a is set to at least about $9 \times 10^{20}$ atoms/cm$^3$. Further, the hydrogen concentration on the interface between the i-type amorphous silicon layer 2a and the p-type amorphous silicon layer 2b is set lower than the hydrogen concentration peak in the i-type amorphous silicon layer 2a. The n-type single-crystalline silicon substrate 1 is an example of the "crystalline semiconductor member" or the "silicon single-crystalline substrate" in the present invention. The i-type amorphous silicon layer 2a is an example of the "first amorphous semiconductor layer" or the "first amorphous silicon layer" in the present invention. The p-type amorphous silicon layer 2b is an example of the "second amorphous semiconductor layer" or the "second amorphous silicon layer" in the present invention.

Another amorphous silicon layer 12, a back electrode 13 of ITO having a thickness of about 70 nm to about 100 nm and another collector 14 of silver having a thickness of several 10 µm are formed on the back surface of the n-type single-crystalline silicon substrate 1 successively from the side closer to the back surface of the n-type single-crystalline silicon substrate 1. The amorphous silicon layer 12 is constituted of another substantially intrinsic i-type amorphous silicon layer 12a having a small thickness of about 9 nm to about 13 nm formed on the back surface of the n-type single-crystalline silicon substrate 1 and a p-type amorphous silicon layer 12b, doped with phosphorus (P), having a thickness of about 10 nm to about 20 nm formed on the i-type amorphous silicon layer 12a. The i-type amorphous silicon layer 12a mainly functions to reduce the interfacial level between the n-type single-crystalline silicon substrate 1 and the p-type amorphous silicon layer 12b. The i-type amorphous silicon layer 12a is set to the small thickness of about 9 nm to about 13 nm, in order not to substantially contribute to power generation. The i-type amorphous silicon layer 12a, the n-type amorphous silicon layer 12b and the back electrode 13 constitute the so-called BSF (back surface field) structure. The i-type amorphous silicon layer 12a is an example of the "third amorphous semiconductor layer" or the "third amorphous silicon layer" in the present invention, and the n-type amorphous silicon layer 12b is an example of the "fourth amorphous semiconductor layer" or the "fourth amorphous silicon layer" in the present invention.

A process of fabricating the photovoltaic device according to the embodiment is described with reference to FIG. 1. As shown in FIG. 1, the n-type single-crystalline silicon substrate 1 is cleaned and set in a vacuum chamber (not shown) and thereafter heated under a temperature condition of not more than about 200° C., thereby removing moisture adhering to the front surface of the n-type single-crystalline silicon substrate 1 to the utmost. Thus, oxygen contained in the moisture adhering to the front surface of the n-type single-crystalline silicon substrate 1 is inhibited from being bonded to silicon and forming defects.

Then, hydrogen ($H_2$) gas is introduced and plasma discharge is performed while holding the substrate temperature at about 170° C., thereby hydrotreating the upper surface of the n-type single-crystalline silicon substrate 1. Thus, the upper surface of the n-type single-crystalline silicon substrate 1 is cleaned and hydrogen atoms are adsorbed in the vicinity of the upper surface of the n-type single-crystalline silicon substrate 1. The adsorbed hydrogen atoms inactivate defects on the upper surface of the n-type single-crystalline silicon substrate 1.

Thereafter the i-type amorphous silicon layer 2a having the thickness of about 9 nm to about 13 nm is formed on the upper surface of the n-type single-crystalline silicon substrate 1 by RF plasma CVD. At this time, conditions for forming the i-type amorphous silicon layer 2a are varied in order of (1) low hydrogen conditions, (2) high hydrogen conditions and (3) low hydrogen conditions according to this embodiment. The high hydrogen conditions are those allowing introduction of a large quantity of hydrogen atoms into the i-type amorphous silicon layer 2a, and the low hydrogen conditions are those allowing introduction of hydrogen atoms into the i-type amorphous silicon layer 2a in a number smaller than that of the hydrogen atoms introduced under the high hydrogen conditions. More specifically, the high hydrogen conditions are a substrate temperature of about 170° C., a hydrogen ($H_2$) gas flow rate of 0 sccm to about 1000 sccm, a silane ($SiH_4$) gas flow rate of about 40 sccm, a pressure of about 40 Pa and RF power density of about 8.33 mW/cm$^2$ to about 80 mW/cm$^2$. The low hydrogen conditions are a substrate temperature of about 170° C., a hydrogen ($H_2$) gas flow rate of 0 sccm, a silane ($SiH_4$) gas flow rate of about 40 sccm, a pressure of about 40 Pa and RF power density of about 8.33 mW/cm$^2$.

Under the low hydrogen conditions, hydrogen atoms can be introduced into the i-type amorphous silicon layer 2a due to hydrogen contained in the silane ($SiH_4$) gas although the hydrogen gas flow rate is 0 sccm. According to the aforementioned embodiment, the height of the hydrogen concentration peak can be controlled by forming the i-type amorphous silicon layer 2a while varying the hydrogen gas flow rate and the RF power density under the high hydrogen conditions.

Then, the p-type amorphous silicon layer 2b, doped with boron (B), having the thickness of about 2 nm to about 5 nm is formed on the i-type amorphous silicon layer 2a by RF plasma CVD under conditions of a substrate temperature of about 170° C., a hydrogen ($H_2$) gas flow rate of 0 sccm to about 1000 sccm, a silane ($SiH_4$) gas flow rate of about 40 sccm, a diborane ($B_2H_6$)/$H_2$ gas (concentration of $B_2H_6$ gas to $H_2$: about 2%) flow rate of about 40 sccm, a pressure of about 40 Pa and RF power density of about 8.33 mW/cm$^2$. A region of the i-type amorphous silicon layer 2a closer to the p-type amorphous silicon layer 2b is formed under the low hydrogen conditions as hereinabove described while the p-type amorphous silicon layer 2b is formed under the aforementioned conditions, whereby the hydrogen concentration on the interface between the i-type amorphous silicon layer 2a and the p-type amorphous silicon layer 2b is lower than the hydrogen concentration peak in the i-type amorphous silicon layer 2a.

Then, the i-type amorphous silicon layer 12a having the thickness of about 9 nm to about 13 nm is formed on the back surface of the n-type single-crystalline silicon substrate 1 by RF plasma CVD under conditions of a substrate temperature of about 170° C., a hydrogen ($H_2$) gas flow rate of 0 sccm to about 1000 sccm, a silane ($SiH_4$) gas flow rate of about 40 sccm, a pressure of about 40 Pa and RF power density of about 8.33 mW/cm$^2$.

Then, the n-type amorphous silicon layer 12b, doped with phosphorus (P), having the thickness of about 10 nm to about 20 nm is formed on the back surface of the i-type amorphous silicon layer 12a by RF plasma CVD under conditions of a substrate temperature of about 170° C., a hydrogen ($H_2$) gas flow rate of 0 sccm to about 1000 sccm, a silane ($SiH_4$) gas flow rate of about 40 sccm, a phosphine ($PH_3$)/$H_2$ gas (concentration of $PH_3$ to $H_2$: about 1%) flow rate of about 40 sccm, a pressure of about 40 Pa and RF power density of about 8.33 mW/cm$^2$.

Then, the front electrode 3 of ITO (indium tin oxide) having the thickness of about 70 nm to about 100 nm is formed on the upper surface of the p-type amorphous silicon layer 2b by sputtering. Thereafter the collector 4 of silver having the thickness of several 10 μm is formed on the prescribed region of the front electrode 3 by screen printing.

Finally, the back electrode 13 of ITO having the thickness of about 70 nm to about 100 nm is formed on the back surface of the n-type amorphous silicon layer 12b by sputtering, and the collector 14 of silver having the thickness of several 10 μm is thereafter formed on the prescribed region of the back electrode 13. Thus, the photovoltaic device according to the embodiment is formed as shown in FIG. 1.

Hydrogen atom concentration profiles were measured as to a photovoltaic device (embodiment) according to this embodiment prepared along the aforementioned process and an exemplary conventional photovoltaic device (prior art). In the exemplary conventional photovoltaic device (prior art), an i-type amorphous silicon layer was formed while being held constant under the aforementioned low hydrogen conditions. The structures of the remaining portions of the exemplary conventional photovoltaic device and a fabrication process therefor were similar to those of the photovoltaic device (embodiment) according to this embodiment.

The hydrogen atom concentration profiles were measured with an SIMS (secondary ion mass spectrometer: ADEPT 1010 by Physical Electronic Incorporation). Measurement conditions were irradiated ion species of Cs$^+$ ions, ion irradiation energy of 1 keV, an entrance angle of 60°, a detected secondary ion source of H$^-$ ions and reference secondary ion species of Si$^-$ ions. In the measurement with the SIMS, hydrogen concentrations were obtained by irradiating the photovoltaic devices with Cs$^+$ ions for measuring the numbers of knocked-out secondary ions (H$^-$ ions and Si$^-$ ions) while calculating the ratios ([H$^-$]/[Si$^-$]) of the numbers of the H$^-$ ions to those of the Si$^-$ ions.

Figure 2:
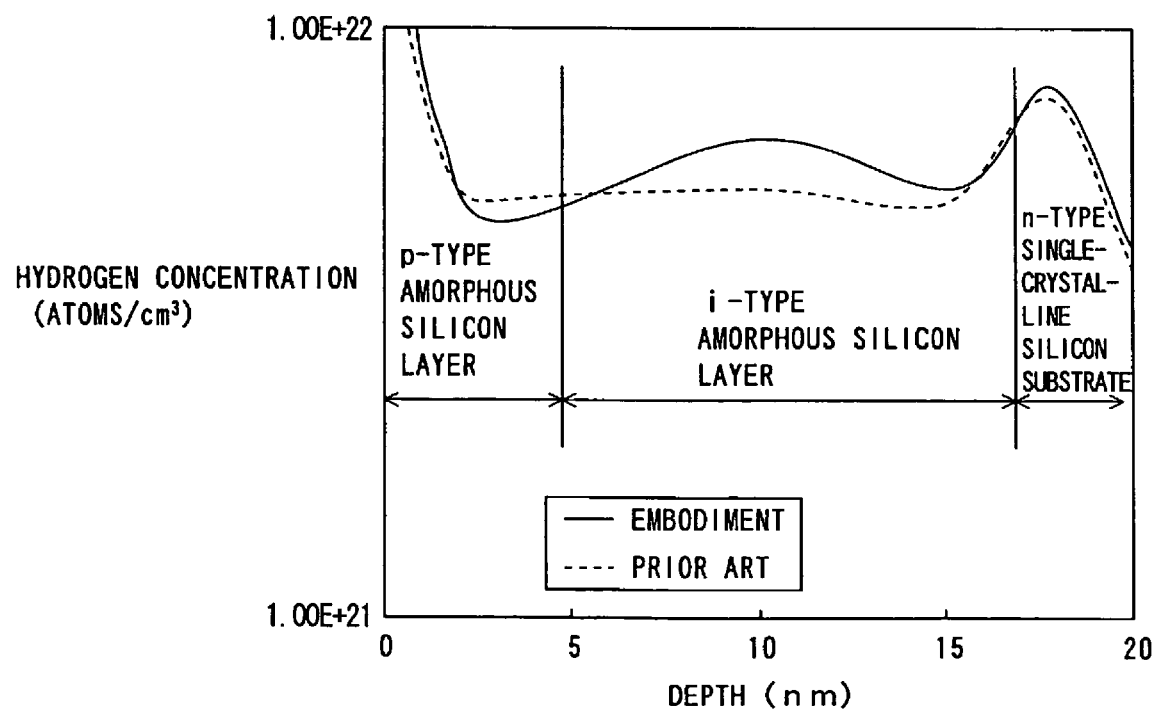
FIG. 2 illustrates hydrogen atom concentration profiles on the front sides (in the vicinity of the upper surfaces of n-type single-crystalline silicon substrates) of photovoltaic devices according to the embodiment of the present invention and prior art measured by SIMS respectively.

FIG. 2 shows the hydrogen atom concentration profiles on the front sides (in the vicinity of the upper surfaces of n-type single-crystalline silicon substrates) of the photovoltaic devices according to the embodiment and the prior art measured with the SIMS. Referring to FIG. 2, it is understood that the photovoltaic device according to the embodiment has a hydrogen concentration peak in the vicinity of the central portion of the i-type amorphous silicon layer along the thickness direction (depth: around 10 nm). It is also understood that the hydrogen concentration on the interface between the i-type amorphous silicon layer and the p-type amorphous silicon layer (depth: around 5 nm) is lower than the hydrogen concentration peak in the i-type amorphous silicon layer. As to the photovoltaic device according to the prior art, on the other hand, it is understood that the hydrogen concentration is substantially constant in the thickness direction of the i-type amorphous silicon layer and lower than the hydrogen concentration peak of the photovoltaic device according to the embodiment.

The aforementioned results have been obtained conceivably for the following reasons: In the photovoltaic device according to the embodiment, the i-type amorphous silicon layer was formed successively under (1) the low hydrogen conditions, (2) the high hydrogen conditions and (3) the low hydrogen conditions, thereby varying the quantity of hydrogen atoms introduced in the thickness direction of the i-type amorphous silicon layer. Further, a region having a large quantity of hydrogen atoms was formed in the vicinity of the central portion of the i-type amorphous silicon layer in the thickness direction due to the high hydrogen conditions. The quantity of hydrogen atoms in this region was larger than that of hydrogen atoms present on the interface between the i-type amorphous silicon layer and the p-type amorphous silicon layer. The photovoltaic device according to the embodiment obtained the hydrogen atom concentration profile shown in FIG. 2 conceivably for the aforementioned reason. In the photovoltaic device according to the prior art, the i-type amorphous silicon layer was formed while being held constant under the low hydrogen conditions, and hence the quantity of hydrogen atoms present in the thickness direction of the i-type amorphous silicon layer was substantially constant and lower than the hydrogen concentration peak in the photovoltaic device according to the embodiment. The photovoltaic device according to the prior art obtained the hydrogen atom concentration profile shown in FIG. 2 conceivably for the aforementioned reason.

According to this embodiment, as hereinabove described, the i-type amorphous silicon layer $2a$ is so formed that the photovoltaic device has the hydrogen concentration peaks therein, whereby the quantity of hydrogen atoms (H) is so increased in the i-type amorphous silicon layer $2a$ that the hydrogen atoms increased in quantity can be bonded to dangling bonds of silicon atoms (Si) forming defects in the i-type amorphous silicon layer $2a$ for inactivating the dangling bonds. Thus, the number of defects can be so reduced in the i-type amorphous silicon layer $2a$ that the defects can be inhibited from capturing carriers. Consequently, the carriers can be inhibited from recombination in the i-type amorphous silicon layer $2a$, whereby the output characteristics of the photovoltaic device can be improved.

According to this embodiment, the number of Si—H bonds can be increased in the i-type amorphous silicon layer $2a$ by increasing the quantity of the hydrogen atoms (H) in the i-type amorphous silicon layer $2a$. In this case, the Si—H bonds having larger bond energy than Si—Si bonds can increase the total interatomic bond energy in the i-type amorphous silicon layer $2a$. Thus, the band gap of the i-type amorphous silicon layer $2a$ can be so increased that a built-in electric field in a p-i-n junction can be increased. Thus, the open-circuit voltage (Voc) of the photovoltaic device can be increased. Further, the light absorption loss of the i-type amorphous silicon layer $2a$ can be reduced due to the increased band gap. Thus, the quantity of light incident upon the n-type single-crystalline silicon substrate 1 can be so increased as to increase the quantity of power generation in the n-type single-crystalline silicon substrate 1. Therefore, the short-circuit current (Isc) of the photovoltaic device can be increased. Further, the i-type amorphous silicon layer $2a$ is so formed in the aforementioned manner that the fill factor (F.F.) of the photovoltaic device can be increased. The open-circuit voltage (Voc), the short-circuit current (Isc) and the fill factor (F.F.) of the photovoltaic device can be so increased as hereinabove described that the cell output (Pmax) thereof can also be. Consequently, the output characteristics of the photovoltaic device can be improved.

According to this embodiment, the i-type amorphous silicon layer $2a$ is so formed that the difference between the hydrogen concentration peak in the i-type amorphous silicon layer $2a$ and the minimum value of the hydrogen concentration in the i-type amorphous silicon layer $2a$ is at least about $9 \times 10^{20}$ atoms/cm$^3$, whereby the i-type amorphous silicon layer $2a$ can be provided with hydrogen atoms in a quantity sufficient for improving the output characteristics of the photovoltaic device.

According to this embodiment, further, the i-type amorphous silicon layers $2a$ and $12a$ are formed with the small thicknesses for substantially not contributing to power generation, whereby the resistance values of the i-type amorphous silicon layers $2a$ and $12a$ in the thickness direction can be inhibited from increase resulting from large thicknesses of the i-type amorphous silicon layers $2a$ and $12a$. Thus, carriers formed in the n-type single-crystalline silicon substrate 1 can be inhibited from difficulty in movement into the p-type amorphous silicon layer $2b$ through the i-type amorphous silicon layer $2a$ as well as from difficulty in movement into the n-type amorphous silicon layer $12b$ through the i-type amorphous silicon layer $12a$. Therefore, the photovoltaic device can be inhibited from reduction of the output characteristics.

According to this embodiment, in addition, the hydrogen concentration on the interface between the i-type amorphous silicon layer $2a$ and the p-type amorphous silicon layer $2b$ is set to the level lower than the hydrogen concentration peak in the i-type amorphous silicon layer $2a$ so that the quantity of hydrogen atoms diffused into the p-type amorphous silicon layer $2b$ from the interface between the i-type amorphous silicon layer $2a$ and the p-type amorphous silicon layer $2b$ can be reduced as compared with a case where the hydrogen concentration on the interface between the i-type amorphous silicon layer $2a$ and the p-type amorphous silicon layer $2b$ is higher than the hydrogen concentration peak in the i-type amorphous silicon layer $2a$. Thus, the rate of activation for the p-type impurity (boron) in the p-type amorphous silicon layer $2b$ can be inhibited from reduction resulting from the diffused hydrogen atoms. Therefore, the photovoltaic device can be inhibited from reduction of the output characteristics as compared with the case where the hydrogen concentration on the interface between the i-type amorphous silicon layer $2a$ and the p-type amorphous silicon layer $2b$ is higher than the hydrogen concentration peak in the i-type amorphous silicon layer $2a$.

According to this embodiment, further, the i-type amorphous silicon layer $2a$ is so formed that the hydrogen concentration peak in the i-type amorphous silicon layer $2a$ is located in the vicinity of the central portion of the i-type amorphous silicon layer $2a$ along the thickness direction, whereby the quantity of hydrogen atoms is increased around the central portion of the i-type amorphous silicon layer $2a$ along the thickness direction and hence the number of defects can be reduced around the central portion of the i-type amorphous silicon layer $2a$ along the thickness direction. Consequently, carriers can be inhibited from recombination in the vicinity of the central portion of the i-type amorphous silicon layer $2a$ along the thickness direction.

Figure 3:
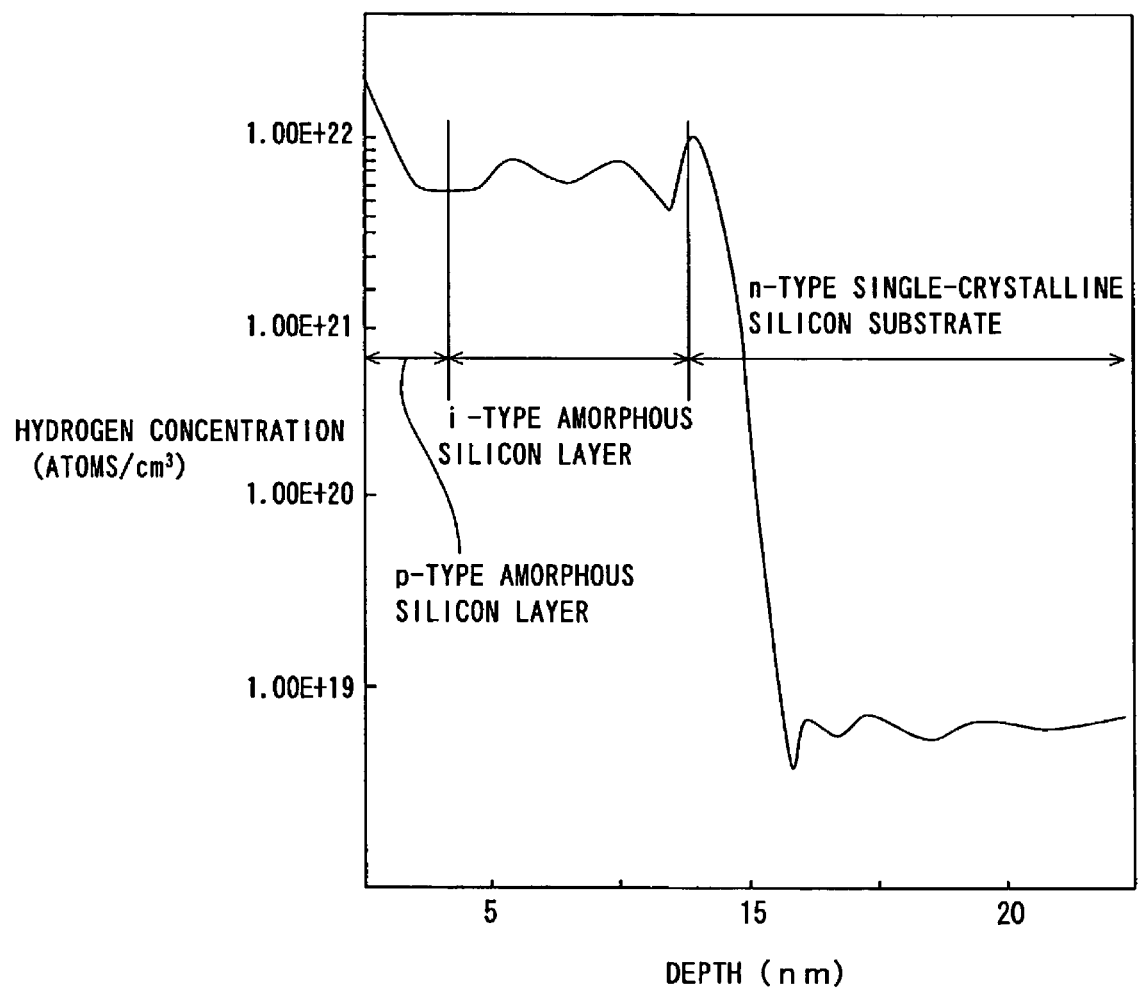
FIG. 3 illustrates a hydrogen concentration profile in a photovoltaic device according to a first modification of the embodiment of the present invention.

Photovoltaic devices according to first, second and third modifications of the aforementioned embodiment are now described. FIG. 3 illustrates a hydrogen concentration profile in the photovoltaic device according to the first modification of the embodiment of the present invention. Referring to FIG. 3, an i-type amorphous silicon layer is formed successively under (1) low hydrogen conditions, (2) high hydrogen conditions, (3) low hydrogen conditions and (4) high hydrogen conditions. In other words, FIG. 3 shows the hydrogen atom concentration profile of the photovoltaic device having the i-type amorphous silicon layer formed by repeating the low hydrogen conditions and the high hydrogen conditions twice respectively. It is understood that two hydrogen concentration peaks are formed around depths of 6 nm and 10 nm in the i-type amorphous silicon layer according to the first modification. This is conceivably because two regions having large quantities of hydrogen atoms are formed along the thickness direction of the i-type amorphous silicon layer due to the double repetition of the low hydrogen conditions and the high hydrogen conditions.

In the photovoltaic device according to the first modification having two hydrogen concentration peaks shown in FIG. 3, it is also possible to introduce a larger quantity of hydrogen atoms under the second high hydrogen conditions than that under the first high hydrogen conditions. In this case, the hydrogen concentration peak closer to a p-type amorphous silicon layer is larger than that closer to an n-type single-crystalline silicon substrate, whereby the valence band of the i-type amorphous silicon layer formed to reflect the shapes of the two hydrogen concentration peaks is stepped. Thus, holes can be more easily moved into the p-type amorphous silicon layer from the n-type single-crystalline silicon substrate through the i-type amorphous silicon layer as compared with those in a photovoltaic device having only one hydrogen concentration peak. Consequently, the holes can be so further easily collected as to improve the output characteristics of the photovoltaic device.

Figure 4:
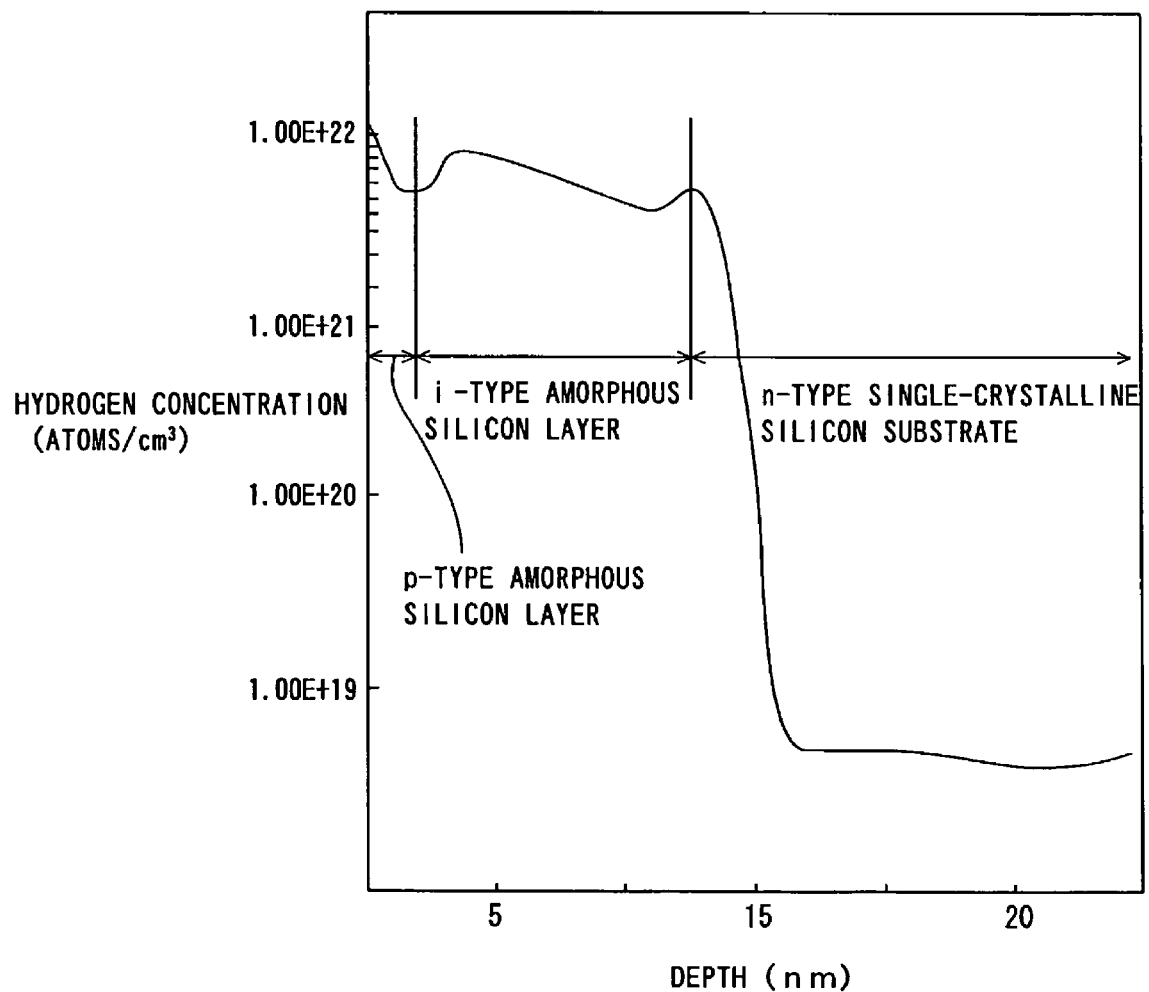
FIG. 4 illustrates a hydrogen concentration profile in a photovoltaic device according to a second modification of the embodiment of the present invention.

FIG. 4 illustrates a hydrogen concentration profile in the photovoltaic device according to the second modification of the embodiment of the present invention. Referring to FIG. 4, an i-type amorphous silicon layer is formed while backwardly displacing the timing for employing the high hydrogen conditions (2) among the (1) low hydrogen conditions, (2) high hydrogen conditions and (3) low hydrogen conditions in the aforementioned embodiment in the photovoltaic device according to the second modification. It is understood from FIG. 4 that a hydrogen concentration peak (depth: around 3.5 nm) in the i-type amorphous silicon layer is located in the vicinity of the interface between the i-type amorphous silicon layer and a p-type amorphous silicon layer (depth: around 2 nm). This is conceivably because a region having a large quantity of hydrogen atoms is formed in the vicinity of the interface between the i-type amorphous silicon layer and the p-type amorphous silicon layer due to the backward displacement of the timing for employing the high hydrogen conditions for forming the i-type amorphous silicon layer.

In addition to the aforementioned effects of the embodiment, the photovoltaic device according to the second modification of the embodiment can attain the following effects: The i-type amorphous silicon layer is so formed that the hydrogen concentration peak in the i-type amorphous silicon layer is located in the vicinity of the interface between the i-type amorphous silicon layer and the p-type amorphous silicon layer, whereby inclination of the valence band of the i-type amorphous silicon layer formed to reflect the shape of the hydrogen concentration peak is reduced in a region closer to an n-type single-crystalline silicon substrate. When the inclination of the valence band is reduced, holes can be easily moved from the n-type single-crystalline silicon substrate into the p-type amorphous silicon layer through the i-type amorphous silicon layer. Consequently, the holes can be so easily collected as to improve the output characteristics of the photovoltaic device.

The photovoltaic device according to the third modification of the embodiment may have a hydrogen concentration peak in an i-type amorphous silicon layer 12a formed on the back surface of an n-type single-crystalline silicon substrate 1 similar to that shown in FIG. 1. More specifically, the hydrogen concentration peak in the i-type amorphous silicon layer 12a may be located in the vicinity of the central portion of the i-type amorphous silicon layer 12a in the thickness direction while the difference between the value of the hydrogen concentration peak and the minimum value of the hydrogen concentration in the i-type amorphous silicon layer 12a may be set to at least about $9 \times 10^{20}$ atoms/cm$^3$. In this case, the quantity of hydrogen atoms (H) is so increased in the i-type amorphous silicon layer 12a formed on the back surface of the n-type single-crystalline silicon substrate 1 that the hydrogen atoms increased in quantity can be bonded to dangling bonds of silicon atoms (Si) forming defects in the i-type amorphous silicon layer 12a for inactivating the dangling bonds. Thus, the number of defects can be so reduced in the i-type amorphous silicon layer 12a formed on the back surface of the n-type single-crystalline silicon substrate 1 that the defects can be inhibited from capturing carriers. Consequently, the carriers can be inhibited from recombination in the i-type amorphous silicon layer 12a formed on the back surface of the n-type single-crystalline silicon substrate 1.

In the photovoltaic device according to the third modification, the hydrogen concentration on the interface between the i-type amorphous silicon layer 12a and an n-type amorphous silicon layer 12b may be set lower than the hydrogen concentration peak in the i-type amorphous silicon layer 12a. In this case, the quantity of hydrogen atoms diffused into the n-type amorphous silicon layer 12b from the interface between the i-type amorphous silicon layer 12a and the n-type amorphous silicon layer 12b can be reduced as compared with a case where the hydrogen concentration on the interface between the i-type amorphous silicon layer 12a and the n-type amorphous silicon layer 12b is higher than the hydrogen concentration peak in the i-type amorphous silicon layer 12a. Thus, the rate of activation for an n-type impurity (phosphorus) in the n-type amorphous silicon layer 12b can be inhibited from reduction resulting from diffused hydrogen atoms. Therefore, the photovoltaic device can be inhibited from reduction of the output characteristics as compared with the case where the hydrogen concentration on the interface between the i-type amorphous silicon layer 12a and the n-type amorphous silicon layer 12b is higher than the hydrogen concentration peak in the i-type amorphous silicon layer 12a.

Experiments performed by actually measuring the output characteristics of photovoltaic devices in order to confirm the aforementioned effects of the embodiment and the first to third modifications thereof are now described. First, an experiment for confirming the effects of the present invention applied to the front side of a photovoltaic device (embodiment) was performed. More specifically, photovoltaic devices (Examples 1-1 and 1-2) having hydrogen atom concentration profiles similar to that of the embodiment shown in FIG. 2 were prepared along the aforementioned process of fabricating the photovoltaic device. Table 1 shows forming conditions for front i-type amorphous silicon layers, p-type amorphous silicon layers, back i-type amorphous silicon layers and n-type amorphous silicon layers of the photovoltaic devices according to Examples 1-1 and 1-2 respectively.

TABLE 1

| Treatment | | Forming Conditions | | | |
|---|---|---|---|---|---|
| | | Substrate Temperature (° C.) | Used Gas | Pressure (Pa) | RF Power Density (nW/cm$^2$) |
| Front Side | i-Type Amorphous Silicon Layer | 170 | H$_2$: 0 sccm~ 1000 sccm SiH$_4$: 40 sccm | 40 | 8.33 |
| | p-Type Amorphous Silicon Layer | 170 | H$_2$: 0 sccm~ 1000 sccm SiH$_4$: 40 sccm B$_2$H$_6$(2%): 40 sccm | 40 | 8.33 |
| Back Side | i-Type Amorphous Silicon Layer | 170 | H$_2$: 0 sccm~ 1000 sccm SiH$_4$: 40 sccm | 40 | 8.33 |
| | n-Type Amorphous Silicon Layer | 170 | H$_2$: 0 sccm~ 1000 sccm SiH$_4$: 40 sccm PH$_2$(1%): 40 sccm | 40 | 8.33 |

The i-type amorphous silicon layers having thicknesses of 12 nm and the p-type amorphous silicon layers having thicknesses of 5 nm were formed on the upper surfaces of n-type single-crystalline silicon substrates by RF plasma CVD under the forming conditions shown in Table 1 respectively. Further, the i-type amorphous silicon layers having thicknesses of 12 nm and the n-type amorphous silicon layers having thicknesses of 20 nm were formed on the back surfaces of the n-type single-crystalline silicon substrates. The structures of the remaining portions of the photovoltaic devices and processes of forming the same were similar to those of the photovoltaic device according to the aforementioned embodiment.

In the photovoltaic devices according to Examples 1-1 and 1-2, the front i-type amorphous silicon layers were formed successively under (1) low hydrogen conditions, (2) high hydrogen conditions and (3) low hydrogen conditions, as shown in Table 2:

TABLE 2

| Treatment | | Forming Conditions | | | |
|---|---|---|---|---|---|
| | | Substrate Temperature (° C.) | Used Gas | Pressure (Pa) | RF Power Density (nW/cm$^2$) |
| Front i-Type Amorphous Silicon Layer | Low Hydrogen Condition | 170 | H$_2$: 0 sccm SiH$_4$: 40 sccm | 40 | 8.33 |
| | High Hydrogen Condition | 170 | H$_2$: 0 sccm~ 1000 sccm SiH$_4$: 40 sccm | 40 | 8.33~80 |
| | Low Hydrogen Condition | 170 | H$_2$: 0 sccm SiH$_4$: 40 sccm | 40 | 8.33 |

In the photovoltaic device according to Example 1-2, the front i-type amorphous silicon layer was formed while setting the high hydrogen conditions to those allowing introduction of a larger quantity of hydrogen atoms than the photovoltaic device according to Example 1-1 in the range of the high hydrogen conditions in Table 2. More specifically, the hydrogen (H$_2$) gas flow rate and the RF power density for the photovoltaic device according to Example 1-2 were set larger than those for the photovoltaic device according to Example 1-1.

Still another photovoltaic device (conventional example 1-1) having a hydrogen atom concentration profile similar to that of the prior art shown in FIG. 2 on its front side was prepared along the aforementioned process of fabricating the photovoltaic device. In the photovoltaic device according to conventional example 1-1, a front i-type amorphous silicon layer, a p-type amorphous silicon layer, a back i-type amorphous silicon layer and an n-type amorphous silicon layer were formed under conditions similar to those shown in Table 1. In the photovoltaic device according to conventional example 1, the front i-type amorphous silicon layer was formed while being held constant under the low hydrogen conditions in Table 2. The structures of the remaining portions and a process of fabricating the photovoltaic device according to conventional example 1-1 are similar to those of the photovoltaic device according to the aforementioned embodiment.

The output characteristics (open-circuit voltage (Voc), short-circuit current (Isc), fill factor (F.F.) and cell output (Pmax)) were measured as to the photovoltaic devices according to Examples 1-1 and 1-2 and conventional example 1-1 prepared in the aforementioned manner. Table 3 shows the results. Referring to Table 3, the column of hydrogen concentration distribution shows differences between hydrogen concentration peaks and the minimum hydrogen concentration values of the i-type amorphous silicon layers in hydrogen atom concentration profiles measured with an SIMS.

TABLE 3

| | Hydrogen Concentration Distribution (atoms/cm$^3$) | Voc(V) | Isc(A) | FF | Pmax(W) |
|---|---|---|---|---|---|
| Conventional Example 1-1 | 4.5 × 10$^{20}$ | 0.685 | 3.724 | 0.746 | 1.90 |
| Example 1-1 | 10.0 × 10$^{20}$ | 0.714 | 3.730 | 0.766 | 2.04 |
| Example 1-2 | 18.5 × 10$^{20}$ | 0.707 | 3.735 | 0.760 | 2.01 |

It is understood from Table 3 that the open-circuit voltages (Voc: 0.714 V and 0.707 V) of the photovoltaic devices according to Examples 1-1 and 1-2 are larger than the open-circuit voltage (Voc: 0.685 V) of the photovoltaic device according to conventional example 1-1. This is conceivably because the band gaps of the i-type amorphous silicon layers in the photovoltaic devices according to Examples 1-1 and 1-2 were increased beyond that in the photovoltaic device according to conventional example 1-1 due to the larger quantities of hydrogen atoms introduced into the i-type amorphous silicon layers for increasing built-in electric fields in p-i-n junctions.

It is also understood from Table 3 that the short-circuit currents (Isc: 3.730 A and 3.735 A) of the photovoltaic devices according to Examples 1-1 and 1-2 are larger than the short-circuit current (Isc: 3.724 A) of the photovoltaic device according to conventional example 1-1. In the photovoltaic devices according to Examples 1-1 and 1-2, light absorption loss levels of the i-type amorphous silicon layers in the photovoltaic devices according to Examples 1-1 and 1-2 were reduced as the band gaps of the i-type amorphous silicon layers were increased, to increase the quantities of light incident upon the n-type single-crystalline silicon substrates located under the i-type amorphous silicon layers. Consequently, the quantities of power generation in the n-type single-crystalline silicon substrates were increased to conceivably increase the short-circuit currents (Isc) beyond that of the photovoltaic device according to conventional example 1-1. It is also understood from Table 3 that the fill factors (F.F.: 0.766 and 0.760) of the photovoltaic devices according to Examples 1-1 and 1-2 are also larger than the fill factor (F.F.: 0.746) of the photovoltaic device according to conventional example 1-1.

It is further understood from Table 3 that the cell outputs (Pmax: 2.04 W and 2.01 W) of the photovoltaic devices according to Examples 1-1 and 1-2 are also larger than the cell output (Pmax: 1.90 W) of the photovoltaic device according to conventional example 1-1. This is conceivably because the open-circuit voltages (Voc), the short-circuit currents (Isc) and the fill factors (F.F.) were increased in the photovoltaic devices according to Examples 1-1 and 1-2 beyond those in the photovoltaic device according to conventional example 1-1. It is also understood that the cell output of the photovoltaic device according to Example 1-2 formed under a larger hydrogen gas flow rate and larger RF power density than the photovoltaic device according to Example 1-1 exhibited a larger cell output than the photovoltaic device according to Example 1-1. This is conceivably because hydrogen atoms were introduced into the photovoltaic device according to Example 1-2 in a quantity larger than those in the photovoltaic device according to Example 1-1.

Another experiment was performed for confirming the effects of the present invention applied to the back side of a photovoltaic device (third modification). More specifically, photovoltaic devices (Examples 1-3 and 1-4) having hydrogen atom concentration profiles similar to that of the photovoltaic device according to the embodiment shown in FIG. 2 on the back sides and a photovoltaic device (conventional example 1-2) having a hydrogen atom concentration profile similar to that of the conventional photovoltaic device shown in FIG. 2 on the back side were prepared and subjected to measurement of output characteristics. At this time, front (light-receiving side) i-type amorphous silicon layers, p-type amorphous silicon layers, back i-type amorphous silicon layers and n-type amorphous silicon layers of the photovoltaic devices were formed by RF plasma CVD under conditions similar to those shown in Table 1.

In the photovoltaic devices according to Examples 1-3 and 1-4, the back i-type amorphous silicon layers were formed successively under (1) low hydrogen conditions, (2) high hydrogen conditions and (3) low hydrogen conditions, as shown in Table 2. In the photovoltaic device according to Example 1-4, the back i-type amorphous silicon layer was formed while setting the high hydrogen conditions to those allowing introduction of a larger quantity of hydrogen atoms than the photovoltaic device according to Example 1-3 in the range of the high hydrogen conditions in Table 2. More specifically, the hydrogen ($H_2$) gas flow rate and the RF power density for the photovoltaic device according to Example 1-4 were set larger than those for the photovoltaic device according to Example 1-3. The front i-type amorphous silicon layers, the p-type amorphous silicon layers, the back i-type amorphous silicon layers and the n-type amorphous silicon layers of the photovoltaic devices according to Examples 1-3 and 1-4 were formed with thicknesses similar to those of the aforementioned photovoltaic devices according to Examples 1-1 and 1-2. The structures of the remaining portions and a process of fabricating the photovoltaic devices according to Examples 1-3 and 1-4 are similar to those of the photovoltaic device according to the aforementioned embodiment. The photovoltaic device according to conventional example 1-2 was prepared absolutely similarly to the aforementioned photovoltaic device according to conventional example 1-1. Table 4 shows measurement results of the output characteristics of the photovoltaic devices according to Examples 1-3 and 1-4 and conventional example 1-2 prepared in the aforementioned manner.

TABLE 4

| | Hydrogen Concentration Distribution (atoms/cm$^3$) | Voc(V) | Isc(A) | FF | Pmax(W) |
|---|---|---|---|---|---|
| Conventional Example 1-2 | $4.5 \times 10^{20}$ | 0.685 | 3.724 | 0.746 | 1.90 |
| Example 1-3 | $9.0 \times 10^{20}$ | 0.692 | 3.723 | 0.759 | 1.96 |
| Example 1-4 | $20.5 \times 10^{20}$ | 0.691 | 3.727 | 0.755 | 1.94 |

It is understood from Table 4 that the output characteristics (open-circuit voltages (Voc) of 0.692 V and 0.691 V, short-circuit currents (Isc) of 3.723 V and 3.727 A, fill factors (F.F.) of 0.759 and 0.755 and cell outputs (Pmax) of 1.96 W and 1.94 W) of the photovoltaic devices according to Examples 1-3 and 1-4 were more improved as compared with the output characteristics (open-circuit voltage (Voc) of 0.685 V, short-circuit current (Isc) of 3.724 A, fill factor (F.F.) of 0.746 and cell output (Pmax) of 1.90 W) of the photovoltaic device according to conventional example 1-2 except the short-circuit current (Isc) of the photovoltaic device according to Example 1-3. This is conceivably because the numbers of defects in the back i-type amorphous silicon layers were reduced in the photovoltaic devices according to Examples 1-3 and 1-4 due to the large quantities of hydrogen atoms similarly to the aforementioned photovoltaic devices according to Examples 1-1 and 1-2.

It is also understood from Table 4 that the degrees of improvement of the output characteristics of the photovoltaic devices according to Examples 1-3 and 1-4 are smaller than those in the photovoltaic devices according to Examples 1-1 and 1-2 shown in Table 3. This is conceivably because the degrees of contribution of the back-side structures of the photovoltaic devices were smaller than those of the front-side structures.

It is further understood from Tables 3 and 4 that the differences (hydrogen concentration distribution) between the hydrogen concentration peaks in the i-type amorphous silicon layers and the minimum hydrogen concentration values in the photovoltaic devices according to Examples 1-1 to 1-4 are at least $9 \times 10^{20}$ atoms/cm$^3$. Thus, it is understood possible to improve the output characteristics of a photovoltaic device when hydrogen concentration distribution is at least $9 \times 10^{20}$ atoms/cm$^3$. This is conceivably because it is possible to provide an i-type amorphous silicon layer with hydrogen atoms in a quantity sufficient for improving the output characteristics of a photovoltaic device when the hydrogen concentration distribution is at least the aforementioned value.

A photovoltaic device (Example 2-1) having a hydrogen atom concentration profile including two peaks similarly to the photovoltaic device according to the first modification of the embodiment shown in FIG. 3 was prepared and subjected to measurement of output characteristics. In the photovoltaic device according to Example 2-1, a front i-type amorphous silicon layer was formed by repeating the low hydrogen conditions and the high hydrogen conditions in Table 2 twice respectively. Table 5 shows the results of measurement of the output characteristics.

TABLE 5

|  | Voc(V) | Isc(A) | FF | Pmax(W) |
|---|---|---|---|---|
| Example 2-1 | 0.703 | 3.714 | 0.747 | 1.951 |

It is understood from Table 5 that the output characteristics (open voltage (Voc) of 0.703 V, short-circuit current (Isc) of 3.714 A, fill factor (F.F.) of 0.747 and cell output (Pmax) of 1.951 W) of the photovoltaic device according to Example 2-1 were more improved as compared with the output characteristics (see Table 3: open-circuit voltage (Voc) of 0.685 V, short-circuit current (Isc) of 3.724 A, fill factor (F.F.) of 0.746 and cell output (Pmax) of 1.90 W) of the photovoltaic device according to conventional example 1-1 except the short-circuit current (Isc). The output characteristics of the photovoltaic device according to Example 2-1 were improved for reasons similar to those for the improvement of the output characteristics of the aforementioned photovoltaic devices according to Examples 1-1 and 1-2.

A photovoltaic device (Example 3-1) having a hydrogen atom concentration profile including a peak located in the vicinity of the interface between an i-type amorphous silicon layer and a p-type amorphous silicon layer similarly to the photovoltaic device according to the second modification of the embodiment shown in FIG. 4 was prepared and subjected to measurement of output characteristics. In the photovoltaic device according to Example 3-1, a front i-type amorphous silicon layer was formed while backwardly displacing the timing for employing the high hydrogen conditions in Table 3. The remaining portions of the photovoltaic device according to Example 3-1 were prepared similarly to those of the aforementioned photovoltaic device according to Example 1-1. The inventor has confirmed that the output characteristics were also more improved in the photovoltaic device according to Example 3-1 as compared with the aforementioned photovoltaic device according to comparative example 1-1.

Although the present invention has been described and illustrated in detail, it is clearly understood that the same is by way of illustration and example only and is not to be taken by way of limitation, the spirit and scope of the present invention being limited only by the terms of the appended claims.

For example, while the p-type amorphous silicon layer 2b is formed on the upper surface of the n-type single-crystalline silicon substrate 1 through the substantially intrinsic i-type amorphous silicon layer 2a in the aforementioned embodiment, the present invention is not restricted to this but an n-type amorphous silicon layer may alternatively be formed on the upper surface of a p-type single-crystalline silicon substrate through a substantially intrinsic i-type amorphous silicon layer. In this case, a p-type amorphous silicon layer may be formed on the back surface of the p-type single-crystalline silicon substrate through another substantially intrinsic i-type amorphous silicon layer.

While amorphous silicon layers 12 (the i-type amorphous silicon layer 12a and the n-type amorphous silicon layer 12b) are formed on the back surface of the n-type single-crystalline silicon substrate 1 to constitute the BSF structure in the aforementioned embodiment, the present invention is not restricted to this but a back electrode may alternatively be formed on the back surface of an n-type single-crystalline silicon substrate without forming an n-side (back) amorphous silicon layer.

While the p-side (front) films are formed in advance in the aforementioned embodiment, the present invention is not restricted to this but n-side (back) films may alternatively be formed in advance.

While only either the p-side (front) i-type amorphous silicon layer 2a or the n-side (back) i-type amorphous silicon layer 12a has the hydrogen concentration peak(s) in each of the aforementioned embodiment and the aforementioned modifications, the present invention is not restricted to this but both of the p- and n-side (front and back) i-type amorphous silicon layers 2a and 12a may alternatively have hydrogen concentration peaks. In this case, the hydrogen concentration on the interface between the front i-type amorphous silicon layer 2a and the p-type amorphous silicon layer 2b may be set lower than the hydrogen concentration peak in the front i-type amorphous silicon layer 2a, while the hydrogen concentration on the interface between the back i-type amorphous silicon layer 12a and the n-type amorphous silicon layer 12b may be set lower than the hydrogen concentration peak in the back i-type amorphous silicon layer 12a.

What is claimed is:

1. A photovoltaic device comprising:
   a crystalline semiconductor member;
   a substantially intrinsic first amorphous semiconductor layer formed on the front surface of said crystalline semiconductor member, said first amorphous semiconductor layer has a small thickness substantially not contributing to power generation; and
   a first conductivity type second amorphous semiconductor layer formed on the front surface of said first amorphous semiconductor layer, wherein
   said crystalline semiconductor member is formed by a second conductivity type single crystalline silicon substrate,
   said first amorphous semiconductor layer includes a hydrogen concentration profile along a thickness direction of the first amorphous semiconductor layer, said hydrogen concentration profile including a concentration peak having a mountain-shaped profile with a peak consisting of a summit of the mountain-shaped profile,
   the difference between the value of said hydrogen concentration peak in said first amorphous semiconductor layer and the minimum value of the hydrogen concentration in said first amorphous semiconductor layer is at least about $9 \times 10^{20}$ atoms/cm$^3$,
   said hydrogen concentration peak in said first amorphous semiconductor layer is located in the vicinity of the central portion of said first amorphous semiconductor layer along the thickness direction or is located on a position closer to the interface between said first amorphous semiconductor layer and said second amorphous semiconductor layer than the central portion of said first amorphous semiconductor layer along the thickness direction, and
   said substantially intrinsic first amorphous semiconductor layer directly contacts said first conductivity type second amorphous semiconductor layer and said second conductivity type single crystalline silicon substrate, and said hydrogen concentration peak consists of one peak or two peaks throughout said substantially intrinsic first amorphous semiconductor layer in total.

2. The photovoltaic device according to claim 1, wherein said first amorphous semiconductor layer has a thickness of at least about 6 nm and not more than about 15 nm.

3. The photovoltaic device according to claim 2, wherein said first amorphous semiconductor layer has a thickness of at least about 9 nm and not more than about 13 nm.

4. The photovoltaic device according to claim 1, wherein the hydrogen concentration on the interface between said first amorphous semiconductor layer and said second amorphous semiconductor layer is set lower than said hydrogen concentration peak in said first amorphous semiconductor layer.

5. The photovoltaic device according to claim 1, wherein said hydrogen concentration peak in said first amorphous semiconductor layer is located in the vicinity of the interface between said first amorphous semiconductor layer and said second amorphous semiconductor layer.

6. The photovoltaic device according to claim 1, having two said hydrogen concentration peaks in said first amorphous semiconductor layer.

7. The photovoltaic device according to claim 1, further comprising:
- a substantially intrinsic third amorphous semiconductor layer formed on the back surface of said crystalline semiconductor member, and
- a fourth amorphous semiconductor layer of the second conductivity type formed on the back surface of said third amorphous semiconductor layer, and having a hydrogen concentration peak in said third amorphous semiconductor layer.

8. The photovoltaic device according to claim 7, wherein said third amorphous semiconductor layer has a small thickness substantially not contributing to power generation.

9. The photovoltaic device according to claim 8, wherein said third amorphous semiconductor layer has a thickness of at least about 6 nm and not more than about 15 nm.

10. The photovoltaic device according to claim 9, wherein said third amorphous semiconductor layer has a thickness of at least about 9 nm and not more than about 13 nm.

11. The photovoltaic device according to claim 7, wherein the hydrogen concentration on the interface between said third amorphous semiconductor layer and said fourth amorphous semiconductor layer is set lower than said hydrogen concentration peak in said third amorphous semiconductor layer.

12. The photovoltaic device according to claim 7, wherein the difference between the value of said hydrogen concentration peak in said third amorphous semiconductor layer and the minimum value of the hydrogen concentration in said third amorphous semiconductor layer is at least about $9 \times 10^{20}$ atoms/cm$^3$.

13. The photovoltaic device according to claim 7, wherein said hydrogen concentration peak in said third amorphous semiconductor layer is located in the vicinity of the central portion of said third amorphous semiconductor layer along the thickness direction.

14. The photovoltaic device according to claim 1, wherein said second amorphous semiconductor layer is a p-type semiconductor layer, and said crystalline semiconductor member is an n-type semiconductor member.

15. The photovoltaic device according to claim 7, wherein said fourth amorphous semiconductor layer is an n-type semiconductor layer.

* * * * *